(12) United States Patent
Choy et al.

(10) Patent No.: US 7,182,618 B1
(45) Date of Patent: Feb. 27, 2007

(54) PC BOARD ASSEMBLY

(75) Inventors: Edmond Choy, Union City, CA (US); Feng Xiao, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/224,151

(22) Filed: Sep. 12, 2005

(51) Int. Cl.
*H01R 13/62* (2006.01)

(52) U.S. Cl. ............... 439/328; 439/108; 439/630; 439/608

(58) Field of Classification Search .......... 439/328, 439/630, 108, 607
See application file for complete search history.

(56) References Cited

U.S. PATENT DOCUMENTS 5,689,405 A * 11/1997 Bethurum .......... 361/737
6,663,407 B1 * 12/2003 Pickles ............ 439/328

FOREIGN PATENT DOCUMENTS

TW M262891 4/2005

* cited by examiner

*Primary Examiner*—Truc Nguyen
(74) *Attorney, Agent, or Firm*—We Te Chung

(57) ABSTRACT

The latching mechanism includes an insulative fixing device, a metallic spring latching device and a metallic grounding device, wherein the fixing device includes the card supporting portion and a positioning post upwardly extending therefrom corresponding to the positioning hole of the electronic card. The latching device includes a connection portion connected to the fixing device, the spring arm extending from the connection portion and the hook portion located on the spring arm and extending toward the card edge connector for locking the rear portion of the electronic card. The grounding device is electrically connected to the latching device and includes mounting legs mechanically and electrically engaged with the corresponding grounding pads formed on the printed circuit board for grounding.

13 Claims, 8 Drawing Sheets

PC BOARD ASSEMBLY

BACKGAROUND

1. Field of the Invention

The invention relates to an electrical assembly, and particularly to a PC (Printed Circuit) board assembly having an electronic card electrically and mechanically connector to a mother board via an electrical connector and a latching mechanism in a parallel manner.

2. The Related Art

Taiwan patent number M261882 discloses a kind of latching mechanism for use with a card edge connector, wherein the latching mechanism including a spring piece including a fixed section and two spring arms, said fixed section being fixed to the printed circuit board and two spring arms extending from the two opposite ends of the fixed section, each of the spring arms including at a distal end a supporting portion and a latching portion, both of which defines positioning openings toward the card edge connector. The supporting portion defines the upward position post toward the card edge connector. The positioning openings confine the rear portion of the card edge connector, and the positioning posts extend through the corresponding positioning hole of the card edge connector. Because the latching mechanism is integrally made from plastic, the latching portion, the support portion and the position post, which extends from the support portion, all are located at the distal end of the spring arm. Thus, during latching or unlatching process with regard to the electronic card, the aforementioned latching portion, the support portion and the positioning post all associatively moved along with the distal end of the spring arm synchronically. Because the positioning hole is so small that the positioning post is essentially compactly received therein, thus resulting in limited moving distance of the distal end of the spring arm. As a result, the latching portion has less moveability and less effective latching area with regard to the rear portion of the electronic card. It is possible for the electronic card to be withdrawn from the latching mechanism in vibration.

China patent publication number 1523714A discloses latching mechanism for use with the card edge connector, wherein the latching mechanism defines a latching portion at a distal end of the spring arm while the support portion and the positioning post, which extends from the support portion, are fixed to the printed circuit board. This design allows the better guiding function of the positioning post and the electronic card does not tend to be withdrawn from the latching portion. Anyhow, the latching mechanism is made from a single metal piece in forming which results in complicated structure and the uncontrollable dimension and position precision. Understandably, this design has difficulties in manufacturing. On the other hand, the metallic latching mechanism disadvantageously tends to result in shorting if the neighboring component is densely arranged therearound.

Applicants have filed Sep. 4, 2005 a patent application with the same title of the instant application which discloses a hybrid type latching mechanism. Anyhow, currently the user requests/indicates that for the plastic type latching mechanism, grounding contact on the top face of the electronic card should be established between the electronic card and the latching mechanism when the latching mechanism locks the electronic card. On the other hand, the user also requests that the latching mechanism may be applied to more than one height conditions between the electronic card and the printed circuit board. Thus, it is desired to have an improved latching mechanism for use with the card edge connector which performs at least the grounding function, and further optionally providing variations adopted to different height applications.

SUMMARY OF THE INVENTION

According to an aspect, the invention is to provide a latching mechanism for use with a card edge connector which electrically and mechanically connects an electronic card to a printed circuit board. The latching mechanism includes an insulative fixing device, a metallic spring latching device and a metallic grounding device, wherein the fixing device includes the card supporting portion and a positioning post upwardly extending therefrom corresponding to the positioning hole of the electronic card. The latching device includes a connection portion connected to the fixing device, the spring arm extending from the connection portion and the hook portion located on the spring arm and extending toward the card edge connector for locking the rear portion of the electronic card. The grounding device is electrically connected to the latching device and includes mounting legs mechanically and electrically engaged with the corresponding grounding pads formed on the printed circuit board for grounding.

Yet, during applying to different height applications between the electronic card and the printed circuit board, it may be required to change dimensions of only one of the latching device and the grounding device for complying with the different applications, thus saving time and money.

Another feature of the invention may optionally include the one-piece grounding device providing a plurality of grounding legs for compliance with the grounding pads on the printed circuit board so as to ease manufacturing.

BEIEF DESCRIPTION OF THE DRAWINGS

DETAILED DESCRIPTION OF THE PREFERRED EMBODIMENT

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
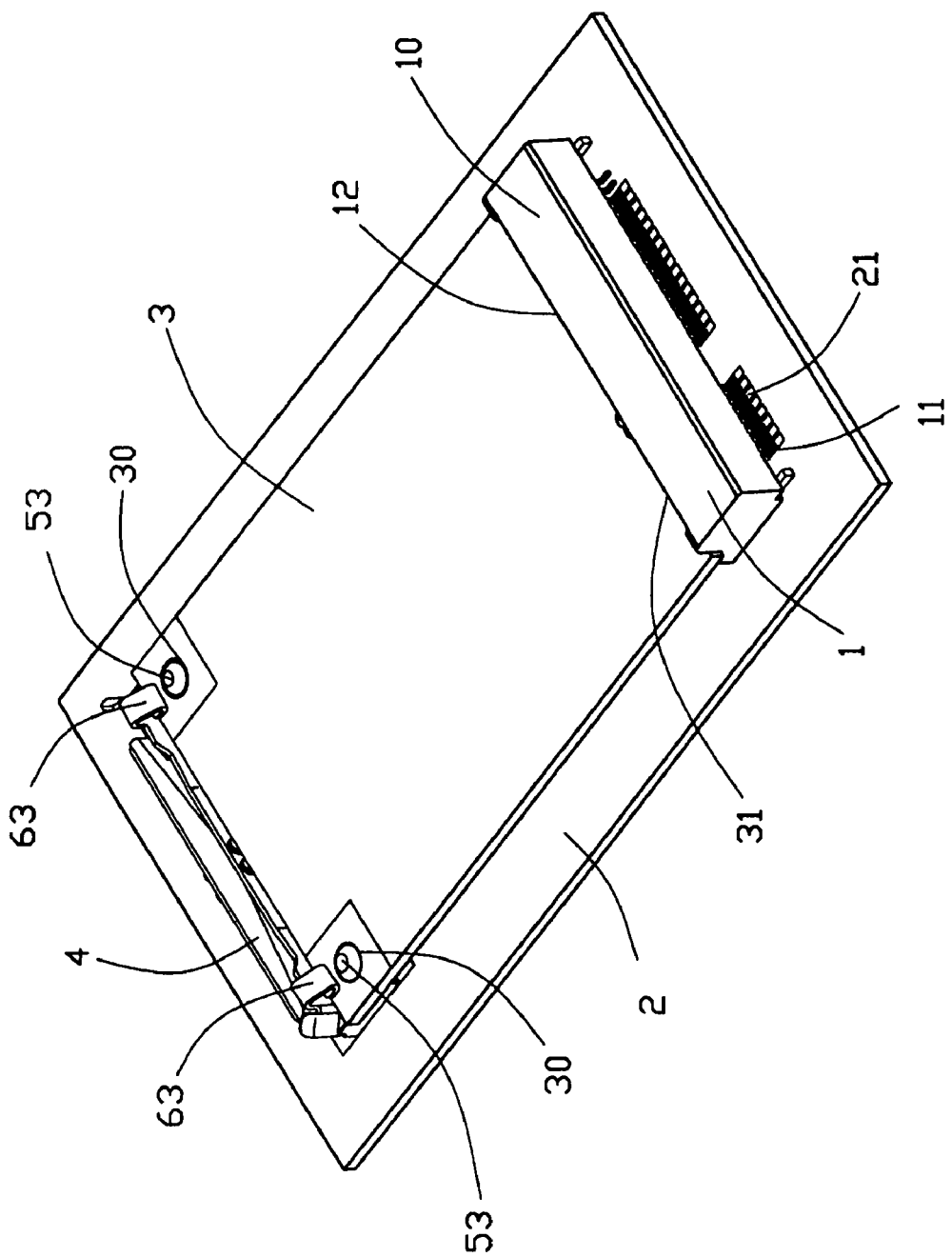
FIG. 1 is a perspective view of the latching mechanism and the corresponding card edge connector on the printed circuit board of FIG. 1, and the corresponding electronic card thereof.
Figure 2:
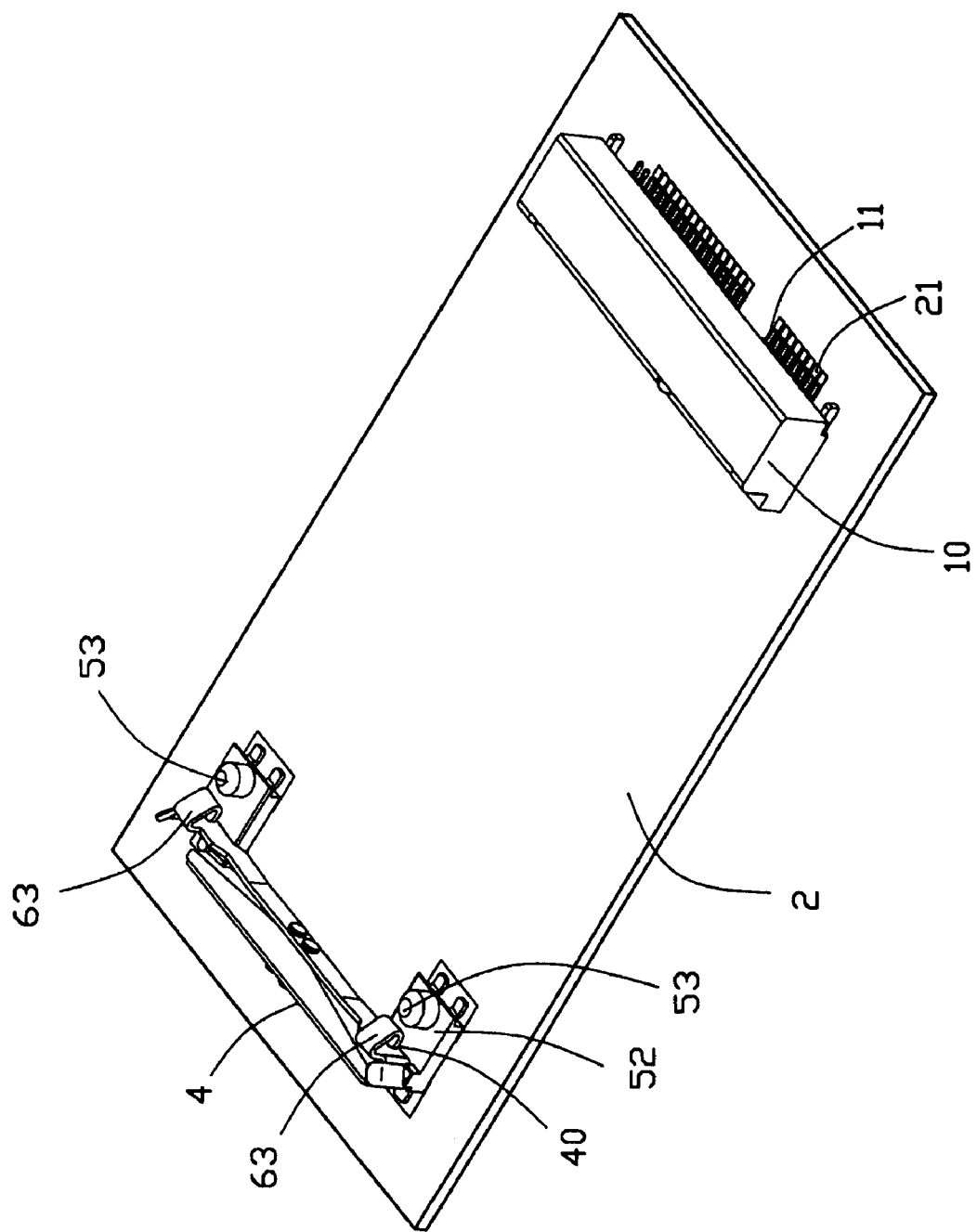
FIG. 2 is a perspective view of the latching mechanism and the corresponding card edge connector both mounted upon a printed circuit board of FIG. 1.
Figure 3:
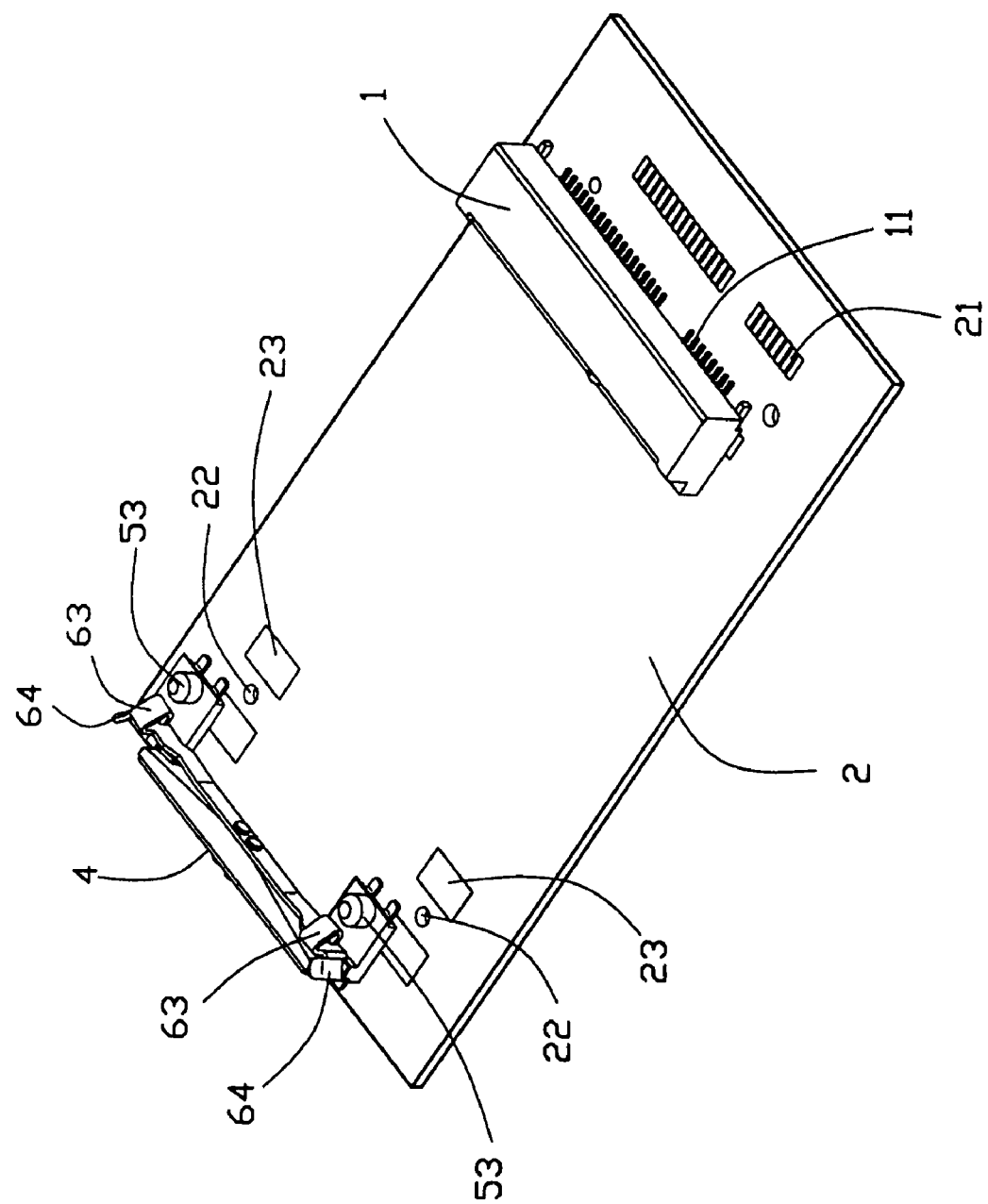
FIG. 3 is an exploded perspective view of the latching mechanism and the corresponding card edge connector spaced above the printed circuit board of FIG. 1.

It will be noted here that for a better understanding, most of like components are designated by like reference numerals throughout the various figures in the embodiments. Referring to FIGS. 1–3, a latching mechanism 4 and a card edge connector 1 are commonly mounted to a printed circuit board 2 for holding an electronic card 3 on the printed circuit board 2.

One end of the printed circuit board 2 includes a plurality of conductive pads 21, and the other end thereof defines a pair of through holes 22. The front end 31 of the electronic card 3 includes a plurality of conductors (not shown), and the rear end thereof defines a pair of positioning holes 30. The card edge connector 1 includes an insulative housing 10 and a plurality of conductive contacts 11 therein. The insulative housing 10 defines a card receiving slot 12. One end of the contact 11 is positioned in the slot 12, and the other end thereof is mechanically and electrically connected to the corresponding conductive pad 21. The front end 31 of the electronic card 3 is inserted into the slot 12 to have the conductors mechanically and electrically connected to the end of the corresponding contact 11 so as to form an electrical connection between the electronic card 3 and the printed circuit board 2.

Figure 4:
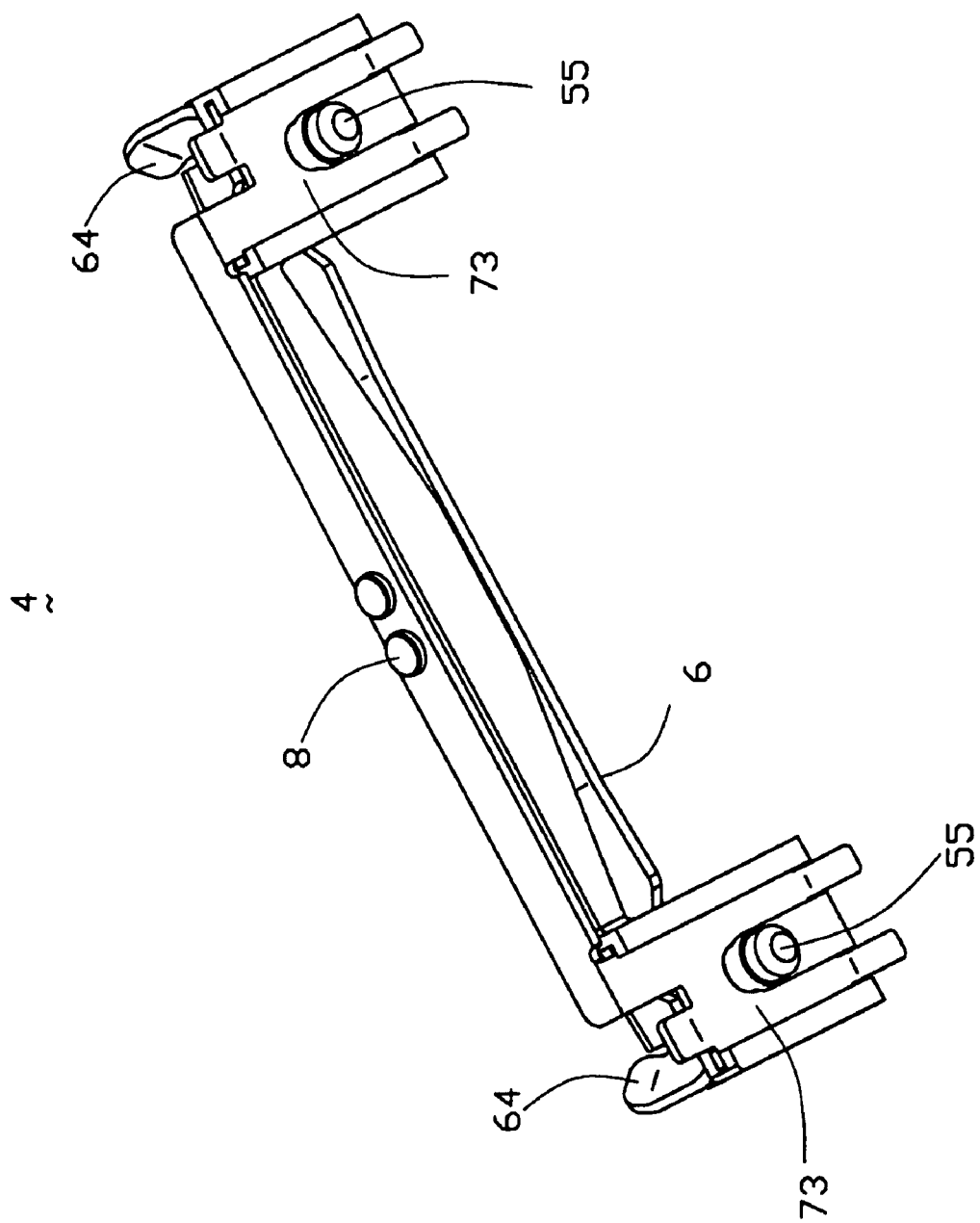
FIG. 4 is an enlarged perspective view of the latching mechanism.
Figure 5:
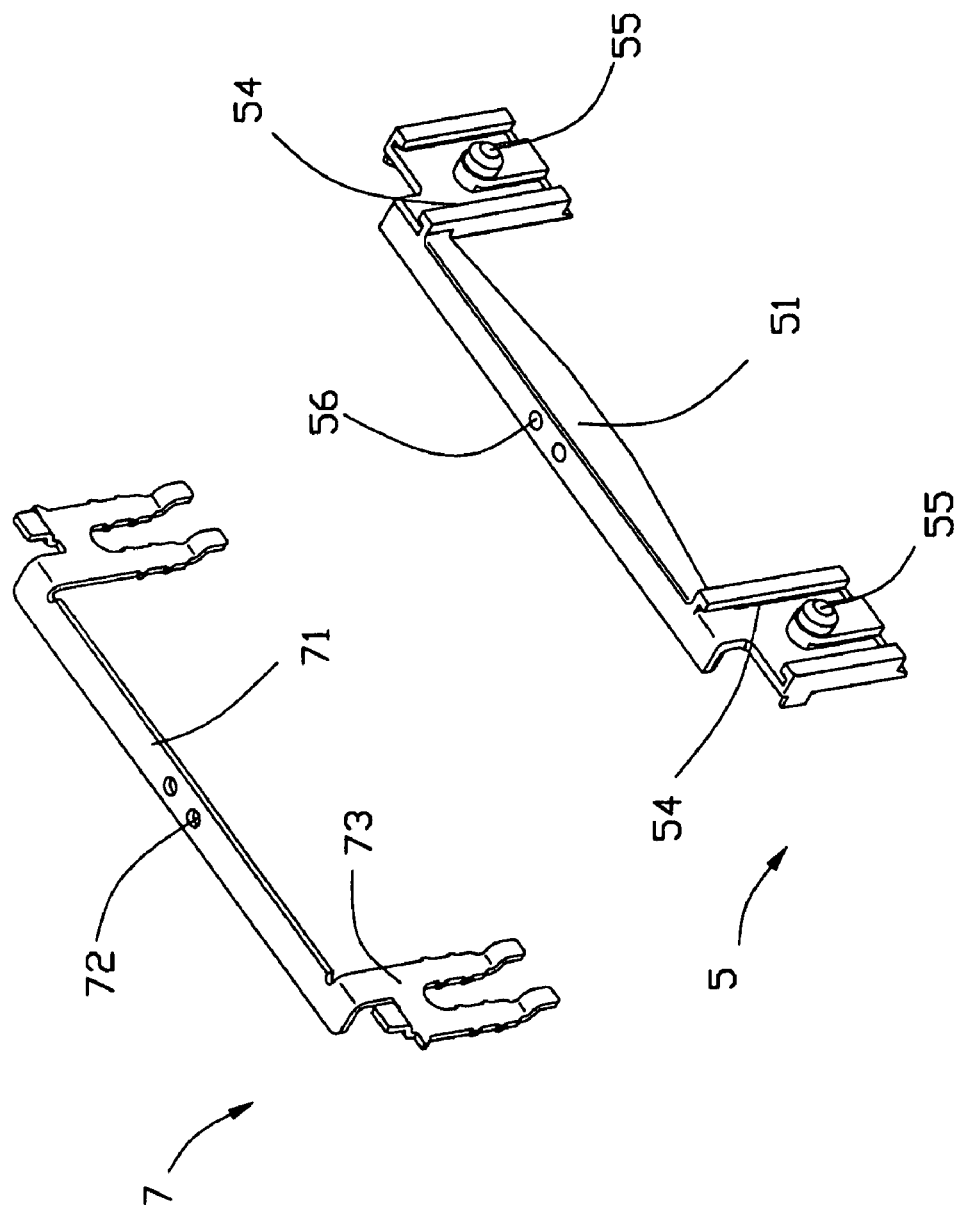
FIG. 5 is an exploded perspective view showing the fixing device and the associated grounding device of the latching mechanism of FIG. 4.
Figure 6:
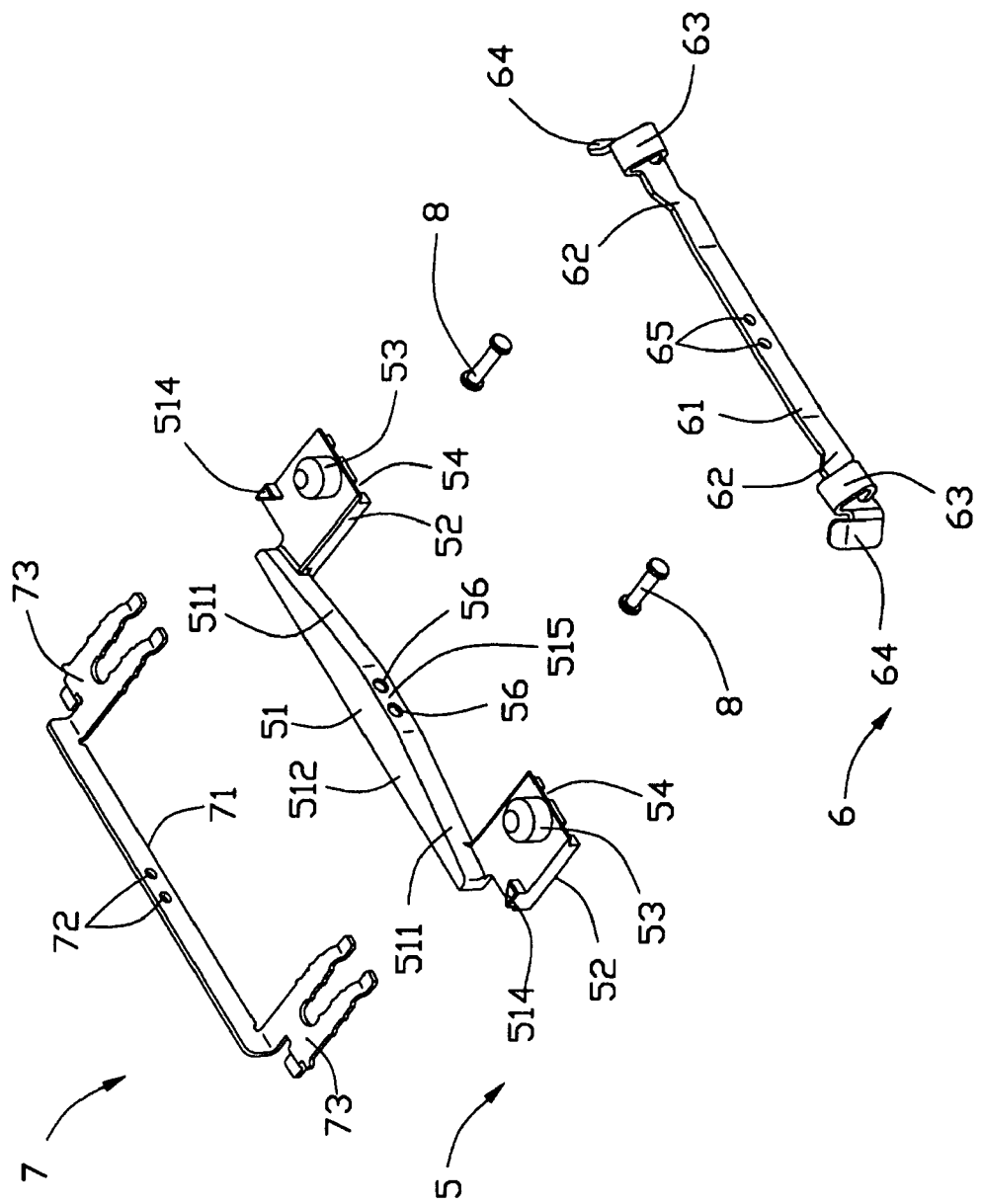
FIG. 6 is an exploded perspective view of the latching mechanism of FIG. 4 showing the fixing device, the grounding device and the latching device.

Further referring to FIGS. 4–6, the latching mechanism 4 includes a fixing device 5, a latching device 6 and a grounding device 7, wherein the fixing device 5 is made from the insulative material and defines an elongated body 51. A pair of supporting portions 52 extend from two opposite ends of the fixing device toward the card edge connector 1, and a positioning post 53 extends upwardly from the supporting portions 52 for coupling to the positioning hole 30 of the electronic card 3. The fixing device 5 further includes the receiving recess 54 for use with the grounding device 7. The fixing device 5 includes the locating posts 55 on the bottom portion, which respectively extend through the through holes 22 of the printed circuit board 2 for mounting the fixing device 5 to the printed circuit board 2. The body 51 includes an attaching section 515 around a middle portion thereof along the lengthwise direction. A pair of wings 511 extend from the attaching section 515 toward the opposite ends in an oblique manner. An suction plane 512 is formed on the top face of the body 51 essentially vertically aligned with the attaching section 515 for suction assembling the fixing device 5 to the printed circuit board 2. A pair of attaching holes 56 are formed in the attaching section 515.

The latching device 6 is made of metal, and includes a connection section 61 on the middle portion along the lengthwise direction thereof. A pair of spring arms 62 extending from the connection section 61 toward the respective ends of the latching device 6, each including a hook section 63 located at the distal end thereof and extending toward the card edge connector 1 with an oblique upward guiding face thereon, and an operation section 64 the same distal end extending away from the card edge connector and opposite to the hook section 63. The connection section 61 includes other attaching holes 65 corresponding to the attaching holes 64.

The grounding device 7 includes an elongated body 71 with two attaching holes 72 in the middle attaching portion, and a pair of grounding legs 73 extending from two opposite ends toward the card edge connector 1.

During assembling, the latching device 6 and the grounding device 7 are respectively located at opposite front and rear sides of the fixing device 5, and all three are fastened together via rivets 8 extending through the corresponding attaching holes 72 of the grounding device 7, the corresponding attaching holes 56 of the fixing device 5 and the corresponding attaching holes 65 of the latching device 6. After assembled, in the latching mechanism 4, a retaining space 40 is formed between the supporting portion 52 and hook section 63 for holding the rear portion of the electronic card 3. The latching mechanism 4 is fastened to the printed circuit board 2 by means of the locating posts 55 extending through the through holes 22 and the grounding legs 73 received in the corresponding receiving recesses 54, are attached to the grounding pads 23 of the printed circuit board 2.

During operation, the front edge of the electronic card 3 is inserted initially into the slot 12 of the card edge connector 1, and rear edge of the electronic card 3 is successively downwardly moved toward the passing the hook sections 63 wherein the spring arms 62 are rearwardly deflected. At the same time, the electronic card 3 is correctly positioned relative to the printed circuit board 2 via the positioning posts 53 extending through the positioning holes 30 in a stable downward movement. When the rear edge of the electronic card 3 completely passes the hook sections 63, the rear portion of the electronic card 3 is essentially located in the retaining space 40 and the spring arms 62 resume the original position to have the hook sections 63 downwardly press the rear edge of the electronic card 3. Under this condition, the electronic card 3 can not further downwardly moved by means of the supporting portions 52, or further horizontally moved by means of the positioning posts 53 extending through the positioning holes 30.

During disassembling, the operation sections 64 are moved rearwardly to have the corresponding spring arms 62 and hook section 63 moved rearwardly associatively, and the rear edge of the card 3 is disengaged from the hook sections 63. It is noted that the wings 511 extend rearwardly and obliquely so as to allow the rearwardly deflected spring arms 62 to be rested thereon for preventing over-deflection rearwardly. On the other hand, the stoppers 514 may prevent forward over-deflection of the latching device 3 via engagement with the operation sections 64. It should be noted that in the embodiment, the contacts of the card edge connector exert a rotative upward force upon the front end of the electronic card 3, similar to those in the traditional SO DIMM connector. Understandably, a grounding path is established between the electronic card 3 and the printed circuit board 2 via the hook 63 of the latching device 6, the rivet 8, and the grounding leg 73 of the associated grounding device 7, to reach the corresponding grounding pad 23 of the printed circuit board 2.

Figure 7:
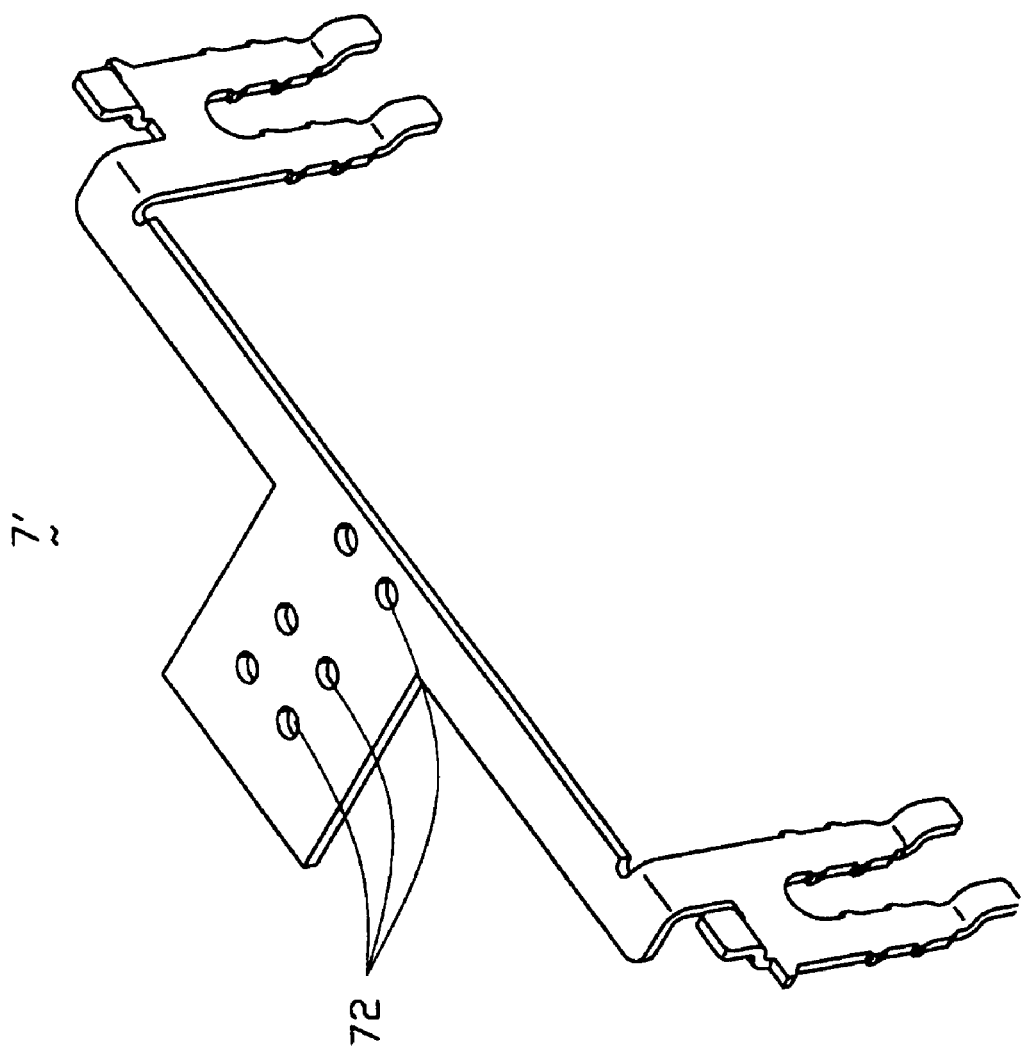
FIG. 7 is a perspective view of the grounding device of another embodiment having the enlarged attachment section for compliance with different height applications.

FIG. 7 shows the alternate grounding device 7' wherein the middle attaching portion is upwardly enlarged providing a plurality of sets of attaching holes 72' therein at different levels for compliance with the different height fixing devices 5, which is used for having the electronic card 3 spaced from the printed circuit board 2 in different height positions, where the rivets 8 extend through the attaching holes 65 of the latching device 6, the attaching holes 56 of the fixing device 5, and only one set of attaching holes 72'. Under this condition, the latching device 6 is not required to be changed. Understandably, the plural sets of attaching holes 72' could be replace by a pair of elongated vertical slots for easing the manufacturing process.

Figure 8:
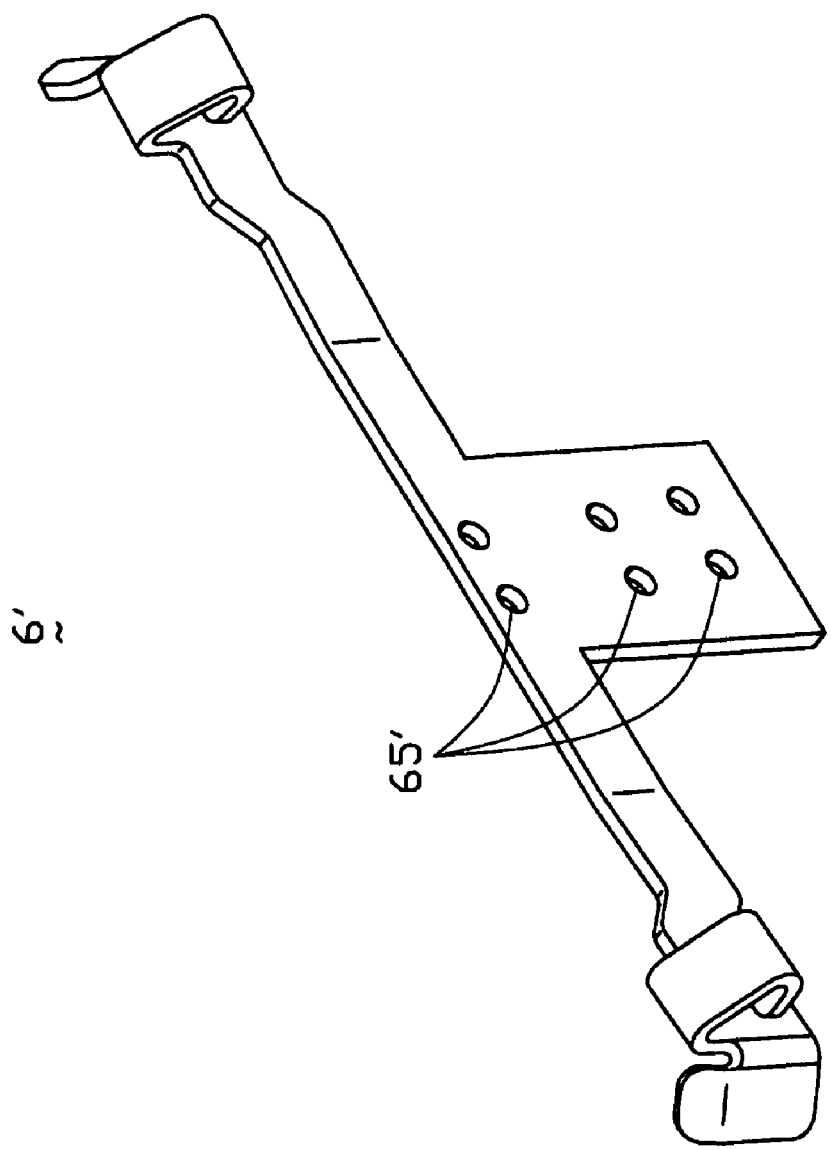
FIG. 8 is a perspective view of the latching device of a third embodiment having the enlarged attaching section for compliance with different height applications.

FIG. 8 shows the latching device 6' of the another embodiment, including an enlarged attaching portion with a plurality of sets of attaching holes 65' at different levels therein for compliance with different height fixing devices 5, which is used for having the electronic card 3 spaced from the printed circuit board 2 in different height positions, where the rivets 8 extend through the attaching holes 72 of the grounding device 7, the attaching holes 56 of the fixing device 5 and only one set of attaching holes 65' of the latching device 6'. Under this condition, the grounding device 7 is not required to be changed. Understandably, different from the alternate embodiment of the grounding device 7', the alternate embodiment of the latching device 6' may require to cut off the enlarged attaching portion for compliance with the lower height application.

The above two alternate embodiments illustrate the flexibilities of manufacturing of the invention. It is also noted that the horizontal assembling way of the grounding device and the latching device with regard to the fixing device also allows a low profile of the whole latching mechanism.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims. Therefore, person of ordinary skill in this field are to understand that all such equivalent structures are to be included within the scope of the following claims.

We claim:

1. A card edge connector assembly comprising:
   a printed circuit board;
   a card edge connector located on a first area of the printed circuit board;
   a latching mechanism located on a second area of the printed circuit board opposite to the first area in a front-to-back direction;
   an electronic card positioned between the first and second areas in a parallel relation with the printed circuit board;
   the latching mechanism including:
   an insulative fixing device positioned upon the printed circuit board;
   a metallic latching device associated with the fixing device and defining a hook section to downwardly pressing a top face of the electronic card for restraining upward movement of the electronic card; and
   a metallic grounding device associated with at least one of the latching device and the fixing device, and including at least one grounding leg which is mechanically and electrically engaged with a grounding pad on the printed circuit board; wherein
   the grounding device and the latching device are electrically connected to each other so that a grounding path between the top face of the electronic card and the printed circuit board via said latching device and said grounding device and the grounding pad; wherein
   the latching device and the grounding device are electrically connected to each other via a metallic pin; wherein
   both the latching device are equipped with attaching holes corresponding to the metallic pin.

2. The assembly as claimed in claim 1, wherein said fixing device defines a restriction device engaged within an aperture of the electronic card to restrain horizontal movement of the electronic card.

3. The assembly as claimed in claim 1, wherein said latching device and said grounding device are discrete from each other.

4. The assembly as claimed in claim 1, wherein said latching device is essentially located on a front side of the fixing device and the grounding device is essentially located on a rear side of the fixing device.

5. The assembly as claimed in claim 1, wherein the fixing device including at least one locating post extending through a through hole in the printed circuit board.

6. The assembly as claimed in claim 1, wherein said fixing device defines means for preventing over-forward deflection of the latching device.

7. The assembly as claimed in claim 1, wherein the grounding device including an elongated body extending along a longitudinal direction perpendicular to said front-to-back direction, and the at least one grounding leg is integrally formed at one longitudinal end of the elongated body, and another grounding leg is integrally formed at the other longitudinal end of the elongated body.

8. The assembly as claimed in claim 1, wherein only one of said grounding device and said latching device is required to be lengthened in a vertical direction to comply with another vertically raised fixing device while still keeping the latching and grounding functions.

9. The assembly as claimed in claim 7, wherein both grounding legs are retainably received in corresponding recesses in a bottom portion of the fixing device.

10. A latching mechanism for retaining an electronic card above a printed circuit board, comprising:
    an insulative fixing device, a metallic latching device and a metallic grounding device associated with one another,
    said fixing device defining a supporting portion with a positioning post upwardly extending therefrom for restraining horizontal movement of the electronic card relative to the printed circuit board;
    a metallic latching device defining a hook for restraining upward movement of the electronic card relative to the printed circuit board; and
    a metallic grounding device including at least one grounding leg for grounding to the printed circuit board; wherein
    the latching device is electrically connected to the grounding device to establish a grounding path, and the latching device includes a section being a part of said grounding path and adapted to engage a top face of the electronic card; wherein
    the latching device and the grounding device are electrically connected to each other via a metallic pin; wherein
    both the latching device are equipped with attaching holes corresponding to the metallic pin.

11. The latching mechanism as claimed in claim 10, wherein the grounding device is discrete from the latching device.

12. The latching mechanism as claimed in claim 10, wherein the hook is higher than the grounding leg when the latching mechanism is mounted on the printed circuit board.

13. The latching mechanism as claimed in claim 10, wherein the latching device and the grounding device are essentially located on opposite front and rear sides of the fixing device.

* * * * *